US012613285B2

(12) United States Patent
Ishii

(10) Patent No.: US 12,613,285 B2
(45) Date of Patent: Apr. 28, 2026

(54) BATTERY MANAGEMENT SYSTEM, CALCULATION SYSTEM, BATTERY DEGRADATION PREDICTION METHOD, AND BATTERY DEGRADATION PREDICTION PROGRAM

(71) Applicant: Panasonic Intellectual Property Management Co., Ltd., Osaka (JP)

(72) Inventor: Yohei Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 532 days.

(21) Appl. No.: 18/006,364

(22) PCT Filed: Jul. 19, 2021

(86) PCT No.: PCT/JP2021/026999
§ 371 (c)(1),
(2) Date: Jan. 20, 2023

(87) PCT Pub. No.: WO2022/024848
PCT Pub. Date: Feb. 3, 2022

(65) Prior Publication Data
US 2023/0266399 A1    Aug. 24, 2023

(30) Foreign Application Priority Data
Jul. 29, 2020    (JP) ................................. 2020-128059

(51) Int. Cl.
*G01R 31/392*        (2019.01)
*G01R 31/367*        (2019.01)
(Continued)

(52) U.S. Cl.
CPC ......... *G01R 31/392* (2019.01); *G01R 31/367* (2019.01); *G01R 31/388* (2019.01); *G01R 31/396* (2019.01)

(58) Field of Classification Search
CPC .. G01R 31/392; G01R 31/396; G01R 31/388; G01R 31/367
See application file for complete search history.

(56) References Cited

U.S. PATENT DOCUMENTS

2010/0297478 A1*  11/2010  Mashiko ............... H01M 10/12
                                            429/7
2017/0054317 A1*   2/2017  Katsuki ................... H02J 7/875
                            (Continued)

FOREIGN PATENT DOCUMENTS

JP      WO2017098686 A1 *  6/2017
WO       2017/098686        6/2017
                            (Continued)

OTHER PUBLICATIONS

Stephen et al., Comparing regression coefficients between models: Concepts and illustrative examples, National Institute of Statistical Sciences (1997) (Year: 1997).*
(Continued)

*Primary Examiner* — Catherine T. Rastovski
*Assistant Examiner* — Sharad Timilsina
(74) *Attorney, Agent, or Firm* — Rimon P.C.

(57) ABSTRACT

SOH estimation unit (4613) estimates a state of health (SOH) of battery (E1, 41) based on measurement data of battery (E1, 41). Deterioration regression curve generation unit (4614) generates a deterioration regression curve of battery (E1, 41) by performing curve regression on a plurality of the SOHs specified in time series for battery (E1, 41). Rapid deterioration determination unit (4615) determines whether or not rapid deterioration has occurred in
(Continued)

battery (E1, 41) based on a difference or a ratio between a deterioration coefficient of a deterioration regression curve of battery (E1, 41) generated based on the plurality of SOHs in a first data section and a deterioration coefficient of a deterioration regression curve of battery (E1, 41) generated based on the plurality of SOHs in a second data section.

8 Claims, 9 Drawing Sheets

(51) Int. Cl.
　　*G01R 31/388*　　　(2019.01)
　　*G01R 31/396*　　　(2019.01)

(56) References Cited

U.S. PATENT DOCUMENTS

| | | | | |
|---|---|---|---|---|
| 2017/0212170 | A1* | 7/2017 | Torai ................... | H01M 10/482 |
| 2018/0246174 | A1* | 8/2018 | Shimosawa .......... | G01R 31/389 |
| 2020/0217901 | A1* | 7/2020 | Sugiyama ......... | H01M 10/4285 |
| 2020/0408842 | A1* | 12/2020 | Sada .................... | G01R 31/389 |
| 2023/0251324 | A1* | 8/2023 | Malloy .................... | B60L 3/12 |
| | | | | 702/63 |

FOREIGN PATENT DOCUMENTS

| | | | | |
|---|---|---|---|---|
| WO | WO-2017098686 | A1 * | 6/2017 | ............ H01M 10/48 |
| WO | 2019/054020 | A1 | 3/2019 | |

OTHER PUBLICATIONS

Comparing coefficient (Year: 1997) (Year: 1997).*
International Search Report of PCT application No. PCT/JP2021/026999 dated Oct. 12, 2021.
The EPC Office Action dated May 13, 2024 for the related European Patent Application No. 21849655.2.

* cited by examiner

BATTERY MANAGEMENT SYSTEM, CALCULATION SYSTEM, BATTERY DEGRADATION PREDICTION METHOD, AND BATTERY DEGRADATION PREDICTION PROGRAM

CROSS-REFERENCE TO RELATED APPLICATIONS

This application is a U.S. national stage application of the PCT International Application No. PCT/JP2021/026999 filed on Jul. 19, 2021, which claims the benefit of foreign priority of Japanese patent application No. 2020-128059 filed on Jul. 29, 2020, the contents all of which are incorporated herein by reference.

TECHNICAL FIELD

The present disclosure relates to a battery management device, a computing system, a battery deterioration predicting method, and a battery deterioration predicting program configured to predict deterioration of a battery.

BACKGROUND ART

Hybrid vehicles (HV), plug-in hybrid vehicles (PHV), and electric vehicles (EV) have become widespread in recent years. In these electrically-driven vehicles, a secondary battery such as a lithium ion battery is mounted as a key device.

When a secondary battery such as a lithium ion battery is repeatedly charged and discharged at a low temperature, rapid deterioration of capacity (hereinafter, referred to as rapid deterioration or tertiary deterioration) is likely to occur. In addition, when the secondary battery is repeatedly charged and discharged at a high rate, the rapid deterioration of the capacity is also likely to occur. The rapid deterioration of the capacity occurs due to a decrease in electrolyte solution, a decrease in electrode plate reaction area, and the like. After the rapid deterioration of the capacity occurs, input and output performance significantly deteriorates. In addition, the rapid deterioration is likely to cause a phenomenon in which lithium dissolved as ions is precipitated as metal. When metal lithium is precipitated, the metal lithium may penetrate a separator and short-circuit a positive electrode and a negative electrode. As described above, after the rapid deterioration of the capacity occurs, the stability and safety of the secondary battery deteriorate, and thus the use of the secondary battery is basically terminated.

As a method of detecting rapid deterioration of the secondary battery, a method has been proposed in which a full charge capacity (FCC) or a capacity retention rate (SOH: State Of Health) of the secondary battery and an elapsed time are used as inputs, and it is determined that the rapid deterioration has occurred when a change amount of a slope of a straight line obtained by performing linear regression on a change amount of the full charge capacity or the capacity retention rate with respect to the elapsed time exceeds a threshold (see, for example, PTL 1).

Citation List

Patent Literature

PTL 1: PCT International Publication No. WO 17/098686 A

SUMMARY OF THE INVENTION

Values of an FCC, a state of charge (SOC), and an SOH calculated on the basis of measurement data of a traveling electrically-driven vehicle are affected by a measurement error and noise of a sensor. When the influence of the error and the noise is large, erroneous determination is likely to increase in the method of performing linear regression on the change amount of the FCC or the SOC described above.

The present disclosure has been made in view of such a situation, and an object thereof is to provide a technique of detecting rapid deterioration of a battery with high accuracy.

In order to solve the above-described problem, a battery management device according to an aspect of the present disclosure includes: a measurement unit configured to measure at least a voltage and a current of a battery; an SOH estimation unit configured to estimate an SOH of the battery based on measurement data of the battery; a deterioration regression curve generation unit configured to perform curve regression on a plurality of the SOHs specified in time series for the battery to generate a deterioration regression curve of the battery; and a rapid deterioration determination unit configured to determine whether or not rapid deterioration has occurred in the battery based on a difference or a ratio between a deterioration coefficient of the deterioration regression curve of the battery generated based on the plurality of SOHs in a first data section and a deterioration coefficient of the deterioration regression curve of the battery generated based on the plurality of SOHs in a second data section.

Any combinations of the configuration elements described above and modifications of the features of the present disclosure in methods, devices, systems, computer programs, and the like are still effective as aspects of the present disclosure.

According to the present disclosure, rapid deterioration of a battery can be detected with high accuracy.

DESCRIPTION OF EMBODIMENT

Figure 1:
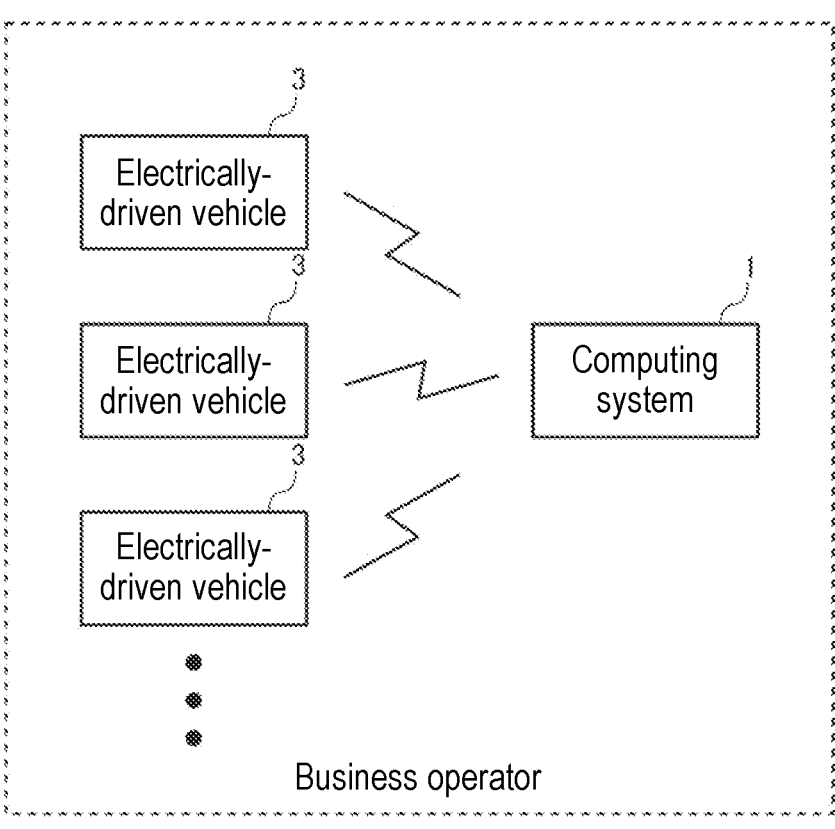
FIG. 1 is a diagram illustrating a computing system used by a business operator according to an exemplary embodiment.

FIG. 1 is a diagram illustrating computing system 1 used by a business operator according to an exemplary embodiment. The business operator has a plurality of electrically-driven vehicles 3 and runs a business using the plurality of electrically-driven vehicles 3. For example, the business operator uses the plurality of electrically-driven vehicles 3 to run a delivery business (home delivery business), a taxi business, a rental car business, or a car sharing business. In the present exemplary embodiment, a pure EV without an engine is assumed as electrically-driven vehicle 3.

Computing system 1 is a system configured to manage business of a business operator. Computing system 1 is constituted of one or a plurality of information processing devices (for example, servers and personal computers (PCs)). A part or all of the information processing devices which constitute computing system 1 may be present in a data center. For example, computing system 1 may be constituted by combining a server (own business server, cloud server, or rental server) in the data center and a client PC in the business operator.

The plurality of electrically-driven vehicles 3 are parked in a parking lot or a garage of a business office of the business operator during standby. The plurality of electrically-driven vehicles 3 have a wireless communication function and can perform wireless communication with computing system 1. The plurality of electrically-driven vehicles 3 transmits travel data including operation data of an on-board secondary battery to computing system 1. While traveling, electrically-driven vehicle 3 may wirelessly transmit the travel data to a server constituting computing system 1 via a network. For example, the travel data may be transmitted at a frequency of once every ten seconds. Alternatively, the travel data for one day may be transmitted in batch at a predetermined timing once a day (for example, at the end of business hours).

In addition, in the case where computing system 1 is constituted of an own business server or a PC installed in the business office, electrically-driven vehicle 3 may transmit the travel data for one day to the own business server or the PC after returning to the business office after the end of business hours. In that case, the travel data may be wirelessly transmitted to the own business server or the PC, or may be connected to the own server or the PC by wire and transmitted via wired communication. Alternatively, the travel data may be transmitted to the own business server or the PC via a recording medium in which the travel data is recorded. In the case where computing system 1 includes a combination of a cloud server and the client PC in the business operator, electrically-driven vehicle 3 may transmit the travel data to the cloud server via the client PC in the business operator.

Figure 2:
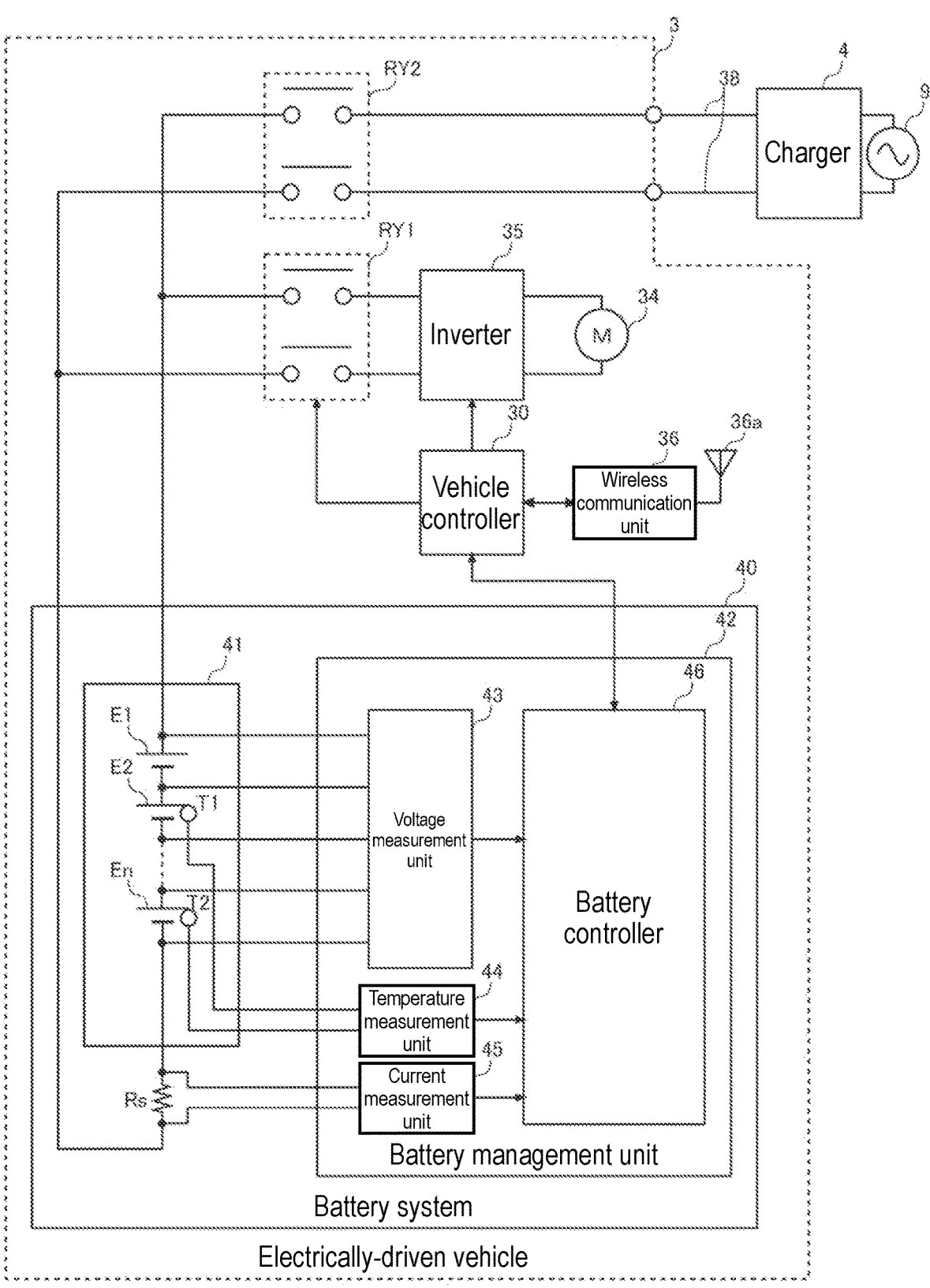
FIG. 2 is a diagram illustrating a detailed configuration of a battery system mounted in an electrically-driven vehicle according to the exemplary embodiment.

FIG. 2 is a diagram illustrating a detailed configuration of battery system 40 mounted in electrically-driven vehicle 3 according to the exemplary embodiment. Battery system 40 is connected to motor 34 through first relay RY1 and inverter 35. Inverter 35 converts DC power supplied from battery system 40 into AC power and supplies the AC power to motor 34 at the time of power running. At the time of regeneration, the AC power supplied from motor 34 is converted into the DC power and supplied to battery system 40. Motor 34 is a three-phase AC motor, and rotates in accordance with the AC power supplied from inverter 35 at the time of power running. At the time of regeneration, rotational energy due to deceleration is converted into the AC power and supplied to inverter 35.

First relay RY1 is a contactor provided in wiring connecting battery system 40 to inverter 35. Vehicle controller 30 controls first relay RY1 in an on-state (closed state) during traveling, and electrically connects battery system 40 to a power system of electrically-driven vehicle 3. Vehicle controller 30 generally controls first relay RY1 in an off-state (open state) during non-traveling, and electrically interrupts battery system 40 from the power system of electrically-driven vehicle 3. Instead of the relay, another type of switch such as a semiconductor switch may be used.

Battery system 40 can be charged from commercial power system 9 by being connected to charger 4 installed outside electrically-driven vehicle 3 with charging cable 38. Charger 4 is connected to commercial power system 9 and charges battery system 40 in electrically-driven vehicle 3 using charging cable 38. In electrically-driven vehicle 3, second relay RY2 is provided in wiring connecting battery system 40 to charger 4. Instead of the relay, another type of switch such as a semiconductor switch may be used. Battery management unit 42 of battery system 40 controls second relay RY2 in the on-state (closed state) before the start of charging, and controls second relay RY2 in the off-state (open state) after the end of charging.

In general, an alternating current is used for normal charging, and a direct current is used for quick charging. In the case of using the alternating current for charging, the AC power is converted into the DC power by an AC/DC converter (not illustrated) interposed between second relay RY2 and battery system 40.

Battery system 40 includes battery module 41 and battery management unit 42, and battery module 41 includes a plurality of cells E1 to En connected in series. Battery module 41 may be constituted of a plurality of battery modules connected in series or series and parallel. For each of the cells, a lithium-ion battery cell, a nickel metal hydride battery cell, a lead battery cell, or the like can be used. Hereinafter, in the present description, an example in which a lithium ion battery cell (nominal voltage of 3.6 V to 3.7 V) is used is assumed. The number of series connections of cells E1 to En is determined in accordance with drive voltage of motor 34.

Shunt resistor Rs is connected to the plurality of cells E1 to En in series. Shunt resistor Rs functions as a current detection element. Instead of shunt resistor Rs, a hall element may be used. In addition, a plurality of temperature sensors T1 and T2 configured to detect temperature of the plurality of cells E1 to En are installed inside battery module 41. One temperature sensor may be installed in the battery module, or one temperature sensor may be installed in each of the plurality of cells. For example, a thermistor can be used for temperature sensors T1 and T2.

Battery management unit 42 includes voltage measurement unit 43, temperature measurement unit 44, current measurement unit 45, and battery controller 46. Each of nodes of cells E1 to En connected in series is connected to voltage measurement unit 43 with corresponding one of a plurality of voltage lines. Voltage measurement unit 43 measures voltage of each of cells E1 to En by measuring voltage between two adjacent voltage lines. Voltage measurement unit 43 transmits the measured voltage of each of cells E1 to En to battery controller 46.

Since voltage measurement unit 43 has a higher voltage than that of battery controller 46, voltage measurement unit 43 and battery controller 46 are connected with a communication line in an insulated state. Voltage measurement unit 43 can be constituted of an application specific integrated circuit (ASIC) or a general-purpose analog front-end integrated circuit (IC). Voltage measurement unit 43 includes a multiplexer and an A/D converter. The multiplexer outputs the voltage between two adjacent voltage lines to the A/D converter in order from the top. The A/D converter converts, into a digital value, an analog voltage to be input from the multiplexer.

Temperature measurement unit 44 includes a voltage dividing resistor and an A/D converter. The A/D converter sequentially converts a plurality of analog voltages divided by the plurality of temperature sensors T1 and T2 and the plurality of voltage dividing resistors into digital values and outputs the digital values to battery controller 46. Battery controller 46 estimates temperatures of the plurality of cells E1 to En based on the digital values. For example, battery controller 46 estimates the temperature of each of cells E1 to En based on a value measured by the temperature sensor closest to the corresponding one of cells E1 to En.

Current measurement unit 45 includes a differential amplifier and an A/D converter. The differential amplifier amplifies voltage across shunt resistor Rs and outputs the voltage to the A/D converter. The A/D converter converts the voltage received from the differential amplifier into a digital value and outputs the digital value to battery controller 46. Battery controller 46 estimates a current flowing through the plurality of cells E1 to En based on the digital value.

Note that in the case where an A/D converter is mounted in battery controller 46 and an analog input port is provided in battery controller 46, temperature measurement unit 44 and current measurement unit 45 may output analog voltages to battery controller 46, and the A/D converter in battery controller 46 may convert the analog voltages into digital values.

Battery controller 46 manages a state of each of the plurality of cells E1 to En based on the voltage, the temperature, and the current of the corresponding one of the plurality of cells E1 to En measured by voltage measurement unit 43, temperature measurement unit 44, and current measurement unit 45, respectively. Battery controller 46 and vehicle controller 30 are connected through an in-vehicle network. For example, a controller area network (CAN) or a local interconnect network (LIN) can be used as the in-vehicle network.

Figure 3:
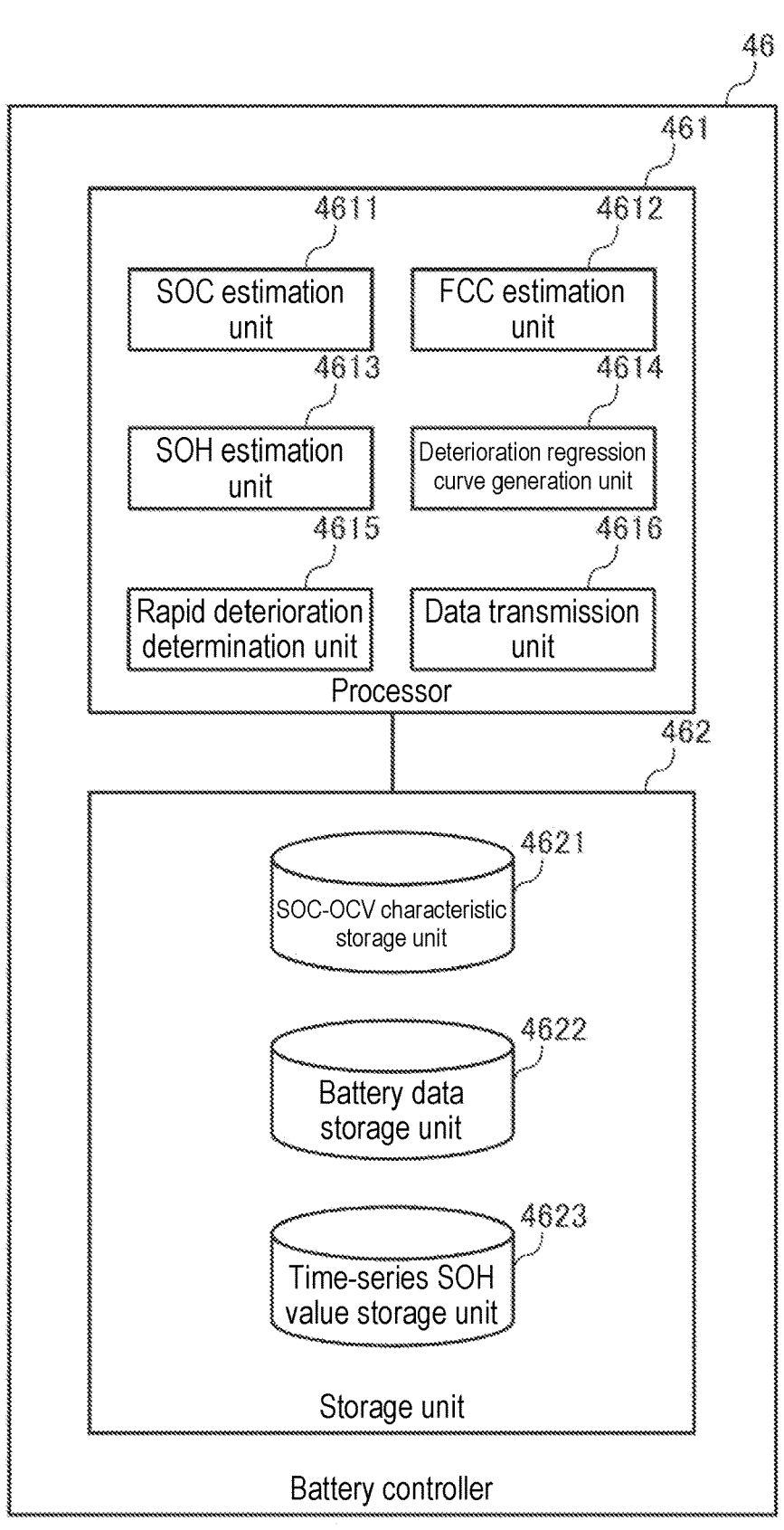
FIG. 3 is a diagram illustrating a configuration example of a battery controller according to a first exemplary embodiment.

FIG. 3 is a diagram illustrating a configuration example of battery controller 46 according to a first exemplary embodiment. Battery controller 46 includes processor 461 and storage unit 462. Processor 461 includes SOC estimation unit 4611, FCC estimation unit 4612, SOH estimation unit 4613, deterioration regression curve generation unit 4614, rapid deterioration determination unit 4615, and data transmission unit 4616. A function of processor 461 can be implemented by cooperation of a hardware resource and a software resource, or by the hardware resource alone. As the hardware resources, a CPU, a ROM, a RAM, an ASIC, a field programmable gate array (FPGA), and other LSIs can be used. A program such as firmware can be used as the software resource.

Storage unit 462 includes SOC-open circuit voltage (OCV) characteristic storage unit 4621, battery data storage unit 4622, and time-series SOH value storage unit 4623. Storage unit 462 includes a nonvolatile recording medium such as an electrically erasable programmable read-only memory (EEPROM) or a NAND flash memory, and records various types of programs and data.

SOC-OCV characteristic storage unit 4621 describes characteristic data of SOC-OCV curves of the plurality of cells E1 to En. The SOC-OCV curves of the plurality of cells E1 to En are generated in advance by a battery manufacturer and registered in SOC-OCV characteristic storage unit 4621 at the time of shipment. The battery manufacturer conducts various tests to derive the SOC-OCV curves of cells E1 to En.

Battery data storage unit 4622 records battery data including voltages, currents, and temperatures of the plurality of cells E1 to En in time series. The battery data may further include the SOC estimated by SOC estimation unit 4611.

Time-series SOH value storage unit 4623 stores time-series data of the SOH estimated by SOH estimation unit 4613. The time-series data of the SOH is recorded, for example, at a frequency of once a day, once every few days, or once a week. Note that time-series SOH value storage unit 4623 and battery data storage unit 4622 may be integrated into one table.

SOC estimation unit 4611 estimates the SOC of each of the plurality of cells E1 to En. SOC estimation unit 4611 estimates the SOC by an OCV method, a current integration method, or a combination thereof. The OCV method is a method of estimating the SOC based on the OCV of each of cells E1 to En measured by voltage measurement unit 43 and the characteristic data of the SOC-OCV curve stored in SOC estimation unit 4611. The current integration method is used to estimate the SOC based on the OCV at the start of charging and discharging of each of cells E1 to En and an integrated value of a current measured by current measurement unit 45. In the current integration method, a measurement error of current measurement unit 45 accumulates as the charge and discharge time increases. Thus, the SOC estimated with the current integration method is preferably corrected using the SOC estimated with the OCV method.

FCC estimation unit 4612 can estimate the FCC of the cell based on the characteristic data of the SOC-OCV curve stored in SOC estimation unit 4611 and two OCVs of the cell measured by voltage measurement unit 43.

Figure 4:
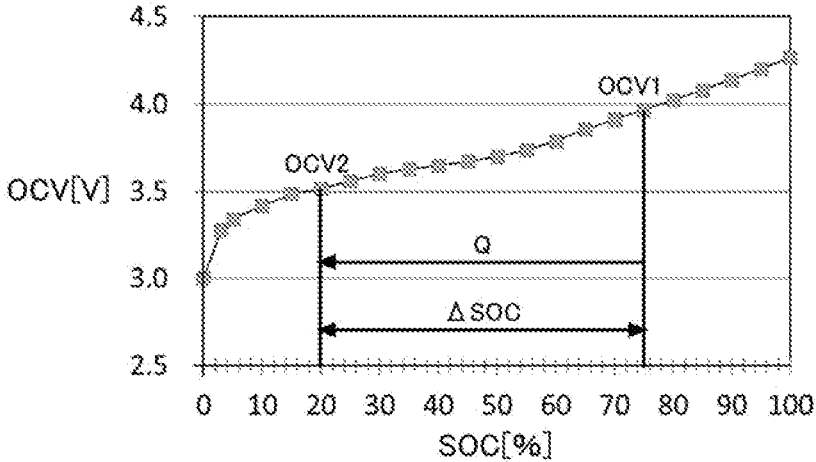
FIG. 4 is a diagram illustrating an estimation method of an FCC.

FIG. 4 is a diagram illustrating an estimation method of an FCC. FCC estimation unit 4612 acquires two OCVs of the cell. FCC estimation unit 4612 refers to the SOC-OCV curve to specify two SOCs respectively corresponding to two voltages, and calculates a difference ASOC between the two SOCs. In the example illustrated in FIG. 4, the two SOCs are 20% and 75%, and the ASOC is 55%.

FCC estimation unit 4612 calculates, based on time transition of the current measured by current measurement unit 45, current integrated amount (=charge and discharge capacity) Q in a period between two time points at which the two OCVs are acquired. FCC estimation unit 4612 can estimate the FCC by calculating the following (Equation 1).

$$\mathrm{FCC} = Q/\Delta\mathrm{SOC} \qquad \text{(Equation 1)}$$

SOH estimation unit 4613 estimates an SOH based on the estimated FCC. The SOH is defined as a ratio of the current FCC to the initial FCC, and the lower the value of SOH (closer to 0%) is, the more the deterioration progresses. SOH estimation unit 4613 can estimate the SOH by calculating the following (Equation 2).

$$\mathrm{SOH} = \text{Current FCC/Initial FCC} \qquad \text{(Equation 2)}$$

The SOH may be obtained by capacity measurement by complete charging and discharging, or may be obtained by adding storage deterioration and cycle deterioration. The storage deterioration can be estimated based on an SOC, a temperature, and a storage deterioration rate. The cycle deterioration can be estimated based on an SOC range to be used, a temperature, a current rate, and a cycle deterioration rate. The storage deterioration rate and the cycle deterioration rate can be derived in advance by experiments or simulations. The SOC, the temperature, the SOC range, and the current rate can be obtained by measurement.

The SOH can also be estimated based on a correlation with an internal resistance of the cell. The internal resistance can be estimated by dividing, by the current value, a voltage drop occurring when a predetermined current flows through the cell for a predetermined time. The internal resistance decreases as the temperature rises, and increases as the SOH decreases.

SOH estimation unit 4613 stores the estimated SOH in time-series SOH value storage unit 4623. For example, SOH estimation unit 4613 estimates the SOH at a frequency of once a day, once every few days, or once a week, and stores the SOH in time-series SOH value storage unit 4623.

Deterioration regression curve generation unit 113 generates a deterioration regression curve of battery module 41 by performing curve regression on a plurality of the SOHs specified in time series for battery module 41. For example, a least squares method can be used for the curve regression.

Figure 5:
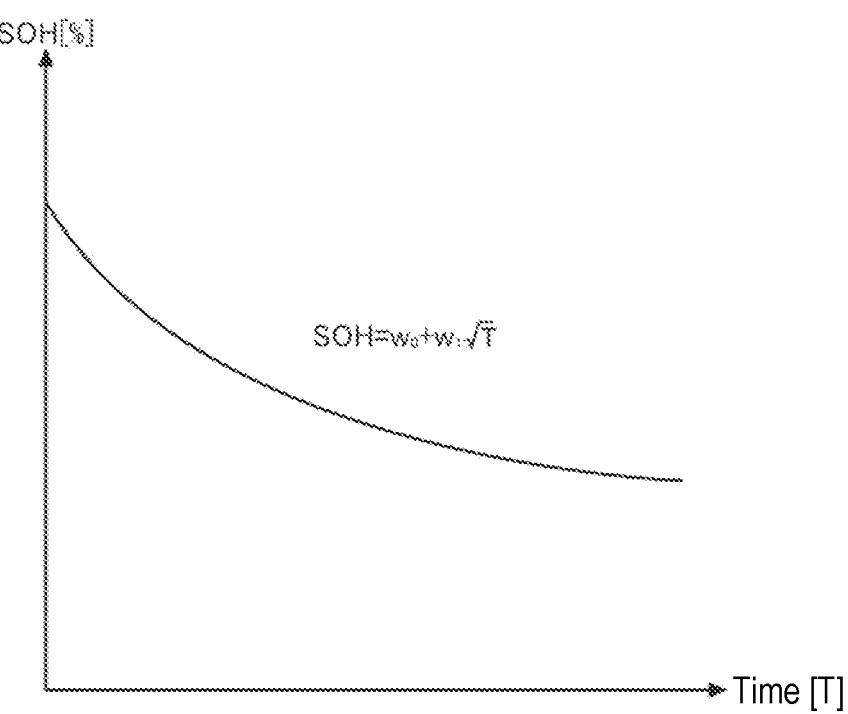
FIG. 5 is a graph showing a deterioration curve of a secondary battery.

FIG. 5 is a graph showing a deterioration curve of the secondary battery. It is known that the deterioration of the secondary battery progresses in proportion to the square root of time (0.5 power law), as shown in the following (Equation 3).

$$SOH = w_0 + w_1 \sqrt{t} \qquad \text{(Equation 3)}$$

$w_0$ is an initial value, and $w_1$ is a deterioration coefficient.

Deterioration regression curve generation unit 4614 obtains deterioration coefficient $w_1$ of (Equation 3) by exponential curve regression to the power of 0.5 with time t as an independent variable and the SOH as a dependent variable. $w_0$ is common and is usually set to a range from 1.0 to 1.1. When an actual initial capacity and a nominal value match, $w_0 = 1.0$ is set, and when the nominal value is set to the minimum guaranteed amount and is set to be lower than the actual initial capacity, $w_0$ is set to a value greater than 1.0.

Figure 6:
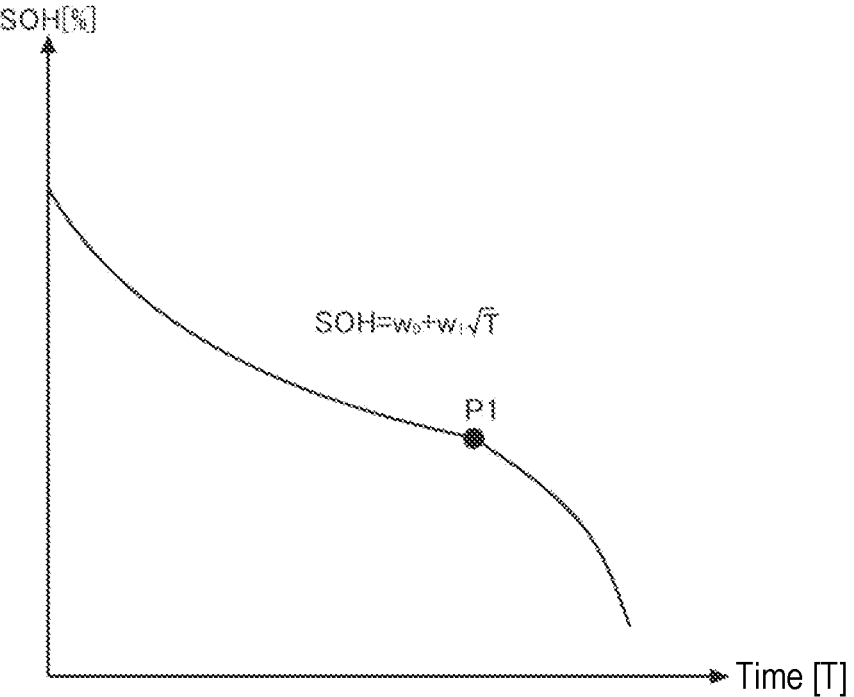
FIG. 6 is a graph showing an example of a deterioration curve when rapid deterioration occurs in a secondary battery.

FIG. 6 is a graph showing an example of a deterioration curve when rapid deterioration occurs in a secondary battery. FIG. 6 illustrates an example in which rapid deterioration occurs at point P1. As described above, when a usage method that places a heavy burden on the secondary battery, such as charging and discharging in a low-temperature or high-temperature environment or charging and discharging at a high rate, is repeatedly performed, rapid deterioration is likely to occur. When the rapid deterioration occurs, the secondary battery basically cannot be used, and thus the life of the secondary battery is shortened. The main factor of the rapid deterioration is the decrease in the electrolyte solution, but it is necessary to disassemble the secondary battery in order to directly measure the amount of the electrolyte solution. It is not realistic to disassemble each of cells E1 to En during use of battery module 41, and as such, a method of determining the rapid deterioration without disassembling each of cell E1 to En is required. On the other hand, in the present exemplary embodiment, occurrence of rapid deterioration is detected by detecting that the SOH of battery module 41 largely deviates from the deterioration curve.

Rapid deterioration determination unit 4615 determines whether the rapid deterioration occurs in battery module 41 based on a difference or a ratio between deterioration coefficient $w_1$ of the deterioration regression curve of battery module 41 generated based on the plurality of SOHs in a first data section and deterioration coefficient $w_1$ of the deterioration regression curve of battery module 41 generated based on the plurality of SOHs in a second data section. When the difference or the ratio deviates from a predetermined range, rapid deterioration determination unit 4615 determines that the rapid deterioration has occurred in battery module 41. That is, rapid deterioration determination unit 4615 determines that the rapid deterioration has occurred when an absolute value of the difference or the ratio exceeds a threshold, and determines that the rapid deterioration has not occurred when the absolute value of the difference or the ratio is less than or equal to the threshold. As the threshold, a value derived by an experiment or a simulation can be used. The determination of the rapid deterioration may be performed in units of cells.

Figures 7, 8:
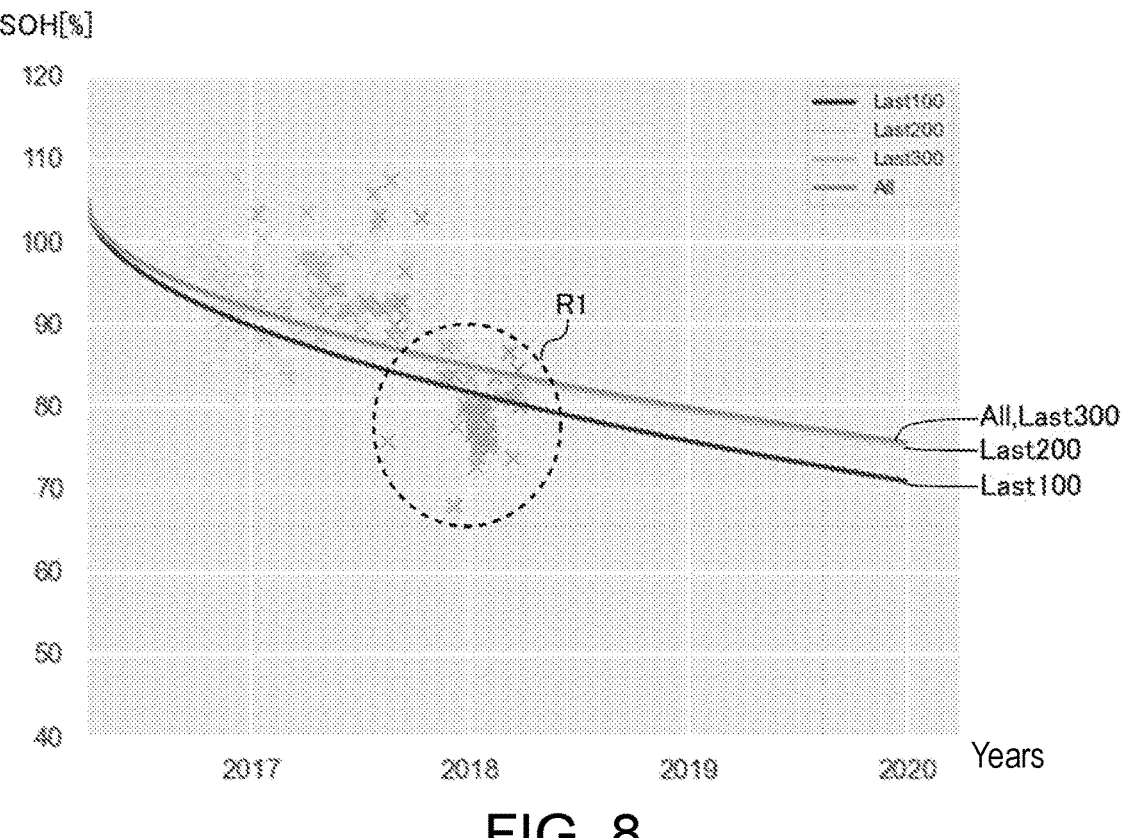
FIG. 7 is a graph showing a specific example of a plurality of the deterioration curves having different data sections.
FIG. 8 is a diagram illustrating a specific example of a first delimiting method of a data section.

FIG. 7 is a graph showing a specific example of a plurality of the deterioration curves having different data sections. Note that $w_0$ of the deterioration regression curve ($SOH = w_0 + w_1 \sqrt{t}$) illustrated in FIG. 7 is set to 1.05. This indicates that an actual initial capacity of battery module 41 is larger than a nominal value. In the example illustrated in FIG. 7, a deterioration curve based on the SOHs of one hundred points in the past, a deterioration curve based on the SOHs of two hundred points in the past, a deterioration curve based on the SOHs of three hundred points in the past, and a deterioration curve based on the SOHs of all points are drawn in a superimposed manner. The deterioration curve based on two hundred points in the past, the deterioration curve based on three hundred points in the past, and the deterioration curve based on all points are substantially the same, and deterioration coefficients $w_1$ of the respective deterioration curves are also substantially the same value. On the other hand, deterioration coefficient $w_1$ of the deterioration curve based on one hundred points in the past has a value smaller than those of deterioration coefficients $w_1$ of the other three deterioration curves.

In the example illustrated in FIG. 7, it can be seen that an SOH included in region R1 surrounded by a dotted circle is significantly lower than an SOH of the previous region. Therefore, it can be estimated that the rapid deterioration has occurred at a certain point in region R1. For example, when the threshold is set to a value corresponding to a difference between deterioration coefficient $w_1$ of the deterioration curve based on one hundred points in the past and deterioration coefficient $w_1$ of the deterioration curve based on two hundred points in the past in region R1, region R1 can be detected by comparing deterioration coefficients $w_1$ of the two.

FIG. 8 is a diagram illustrating a specific example of a first delimiting method of a data section. The first delimiting method is a method in which end points of a plurality of the data sections are made common and the number of pieces of data traced back to the past is changed. For example, the first data section is set to a section including a pieces of the SOH in the past from the last specified SOH. For example, the second data section is set to a section including b (b>a) pieces of the SOH in the past from the last specified SOH. For example, a third data section is set to a section including c (c>b>a) pieces of the SOH in the past from the last specified SOH. In the example illustrated in FIG. 8, a=100, b=200, and c=300.

Figure 9:
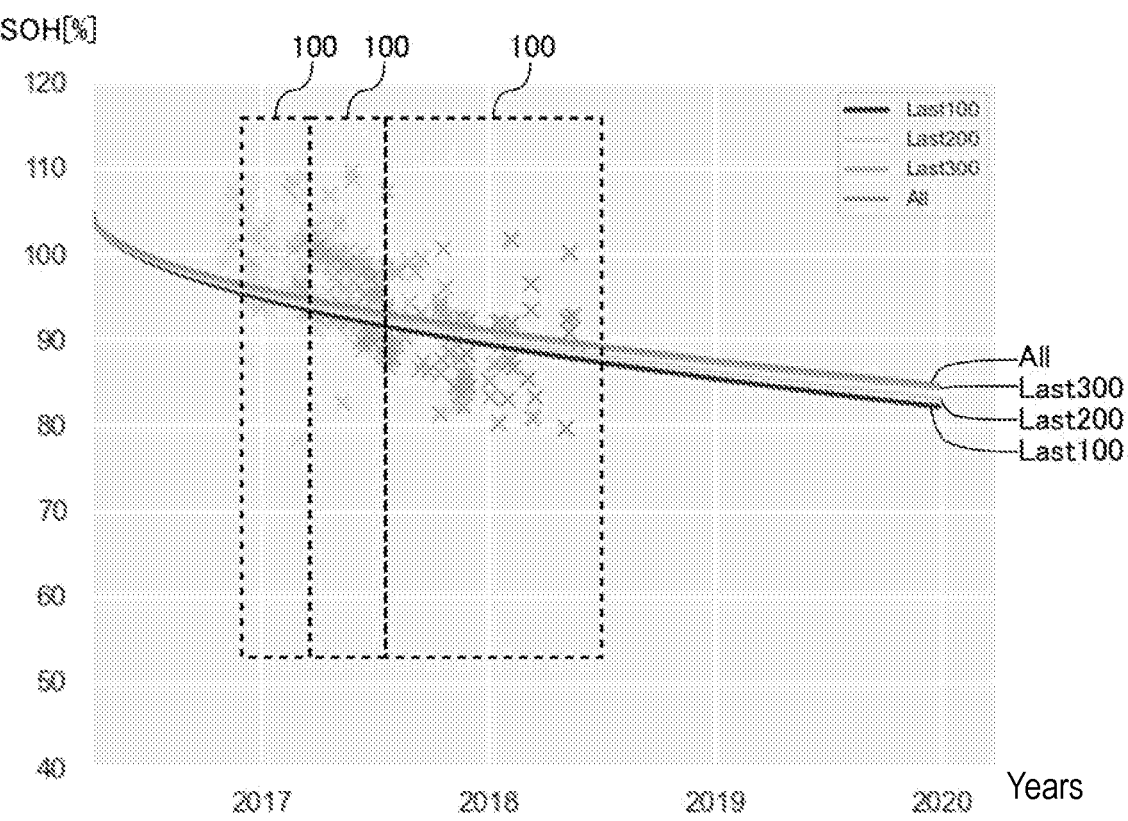
FIG. 9 is a diagram illustrating a specific example of a second delimiting method of a data section.

FIG. 9 is a diagram illustrating a specific example of a second delimiting method of a data section. The second delimiting method is a delimiting method in which the number of a plurality of data sections is made common and the data sections are sequentially traced back to the past. The first data section is set to a section including a pieces of the SOH in the past from the last specified SOH. The second data section is set to a section including a pieces of the SOH in the past from the last specified SOH excluding the SOH included in the first data section. The third data section is set to a section including a pieces of the SOH in the past from the last specified SOH excluding the SOH included in the first data section and the second data section. In the example illustrated in FIG. 9, a=100.

The description returns to FIG. 3. Data transmission unit 4616 of battery controller 46 notifies vehicle controller 30 of the voltages, currents, temperatures, SOCs, FCCs, and SOHs of the plurality of cells E1 to En via the in-vehicle network. Vehicle controller 30 generates travel data including battery data and vehicle data. The battery data includes voltages, currents, and temperatures of the plurality of cells E1 to En. Depending on models of battery system 40, the SOC can be included in the battery data in addition to the voltage, the current, and the temperature. Further, some models can include at least one of the FCC and the SOH in addition to the voltage, the current, the temperature, and the SOC. The vehicle data can include an average speed, a travel distance, a travel route, and the like.

When rapid deterioration determination unit 4615 detects the rapid deterioration of battery module 41, data transmission unit 4616 notifies vehicle controller 30 of a rapid deterioration detection signal via the in-vehicle network. Upon receiving the rapid deterioration detection signal of battery module 41, vehicle controller 30 turns on a warning lamp indicating an abnormality of battery module 41 in a meter panel provided in the driver's seat to notify a driver of the abnormality of battery module 41. In addition, vehicle controller 30 may notify the driver of the abnormality of battery module 41 by voice synthesis output.

Wireless communication unit 36 performs signal processing for wireless connection to a network via antenna 36a. In the present exemplary embodiment, wireless communication unit 36 wirelessly transmits the travel data acquired from vehicle controller 30 to computing system 1. Further, wireless communication unit 36 wirelessly transmits the rapid deterioration detection signal of battery module 41 acquired from vehicle controller 30 to computing system 1. Examples of a wireless communication network to which electrically-driven vehicle 3 can be wirelessly connected include a cellular phone network (cellular network), a wireless local area network (LAN), an electronic toll collection system (ETC), dedicated short range communications (DSRC), Vehicle-to-Infrastructure (V2I), and Vehicle-to-Vehicle (V2V).

Figure 10:
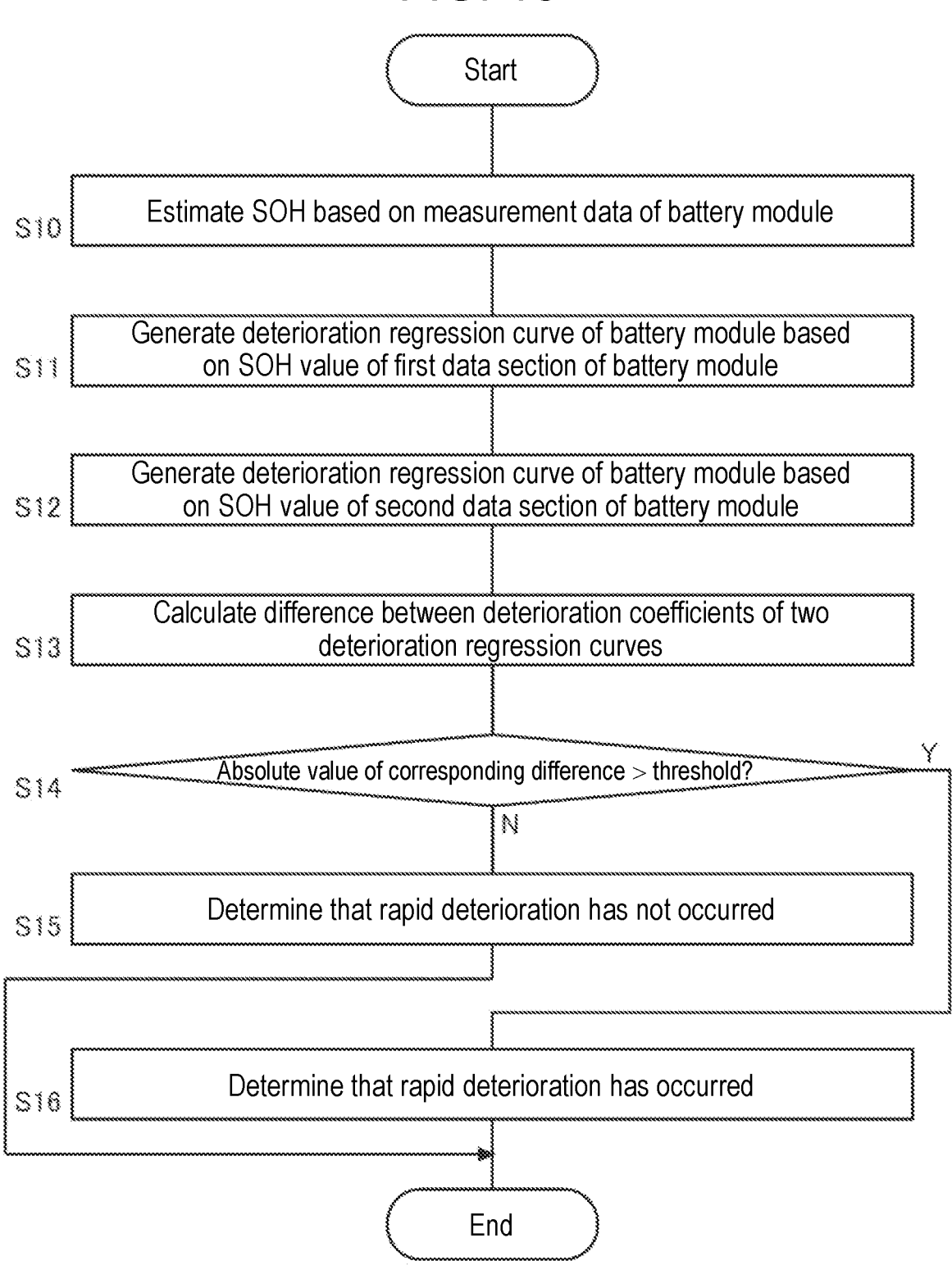
FIG. 10 is a flowchart showing a flow of rapid deterioration determination processing of a battery module by a battery management unit.

FIG. 10 is a flowchart showing a flow of rapid deterioration determination processing of battery module 41 by battery management unit 42. SOH estimation unit 4613 estimates the SOH of battery module 41 based on the measurement data of battery module 41 (S10).

At the timing of determining the presence or absence of the rapid deterioration of battery module 41, deterioration regression curve generation unit 4614 generates a first deterioration regression curve of battery module 41 by performing curve regression on the plurality of SOHs in the first data section of battery module 41 (S11). At the same time, deterioration regression curve generation unit 4614 generates a second deterioration regression curve of battery module 41 by performing curve regression on the plurality of SOHs in the second data section of battery module 41 (S12).

Rapid deterioration determination unit 4615 calculates a difference between deterioration coefficient $w_1$ of the first deterioration regression curve and deterioration coefficient $w_1$ of the second deterioration regression curve (S13). When the absolute value of the difference therebetween is less than or equal to a threshold (N in S14), rapid deterioration determination unit 4615 determines that no rapid deterioration has occurred in battery module 41 (S15). When the absolute value of the difference therebetween exceeds the threshold (Y in S14), rapid deterioration determination unit 4615 determines that rapid deterioration has occurred in battery module 41 (S16).

In the first exemplary embodiment described above, an example in which battery management unit 42 performs the rapid deterioration determination processing of battery module 41 has been described. In this regard, computing system 1 may perform the rapid deterioration determination processing of battery module 41.

Figure 11:
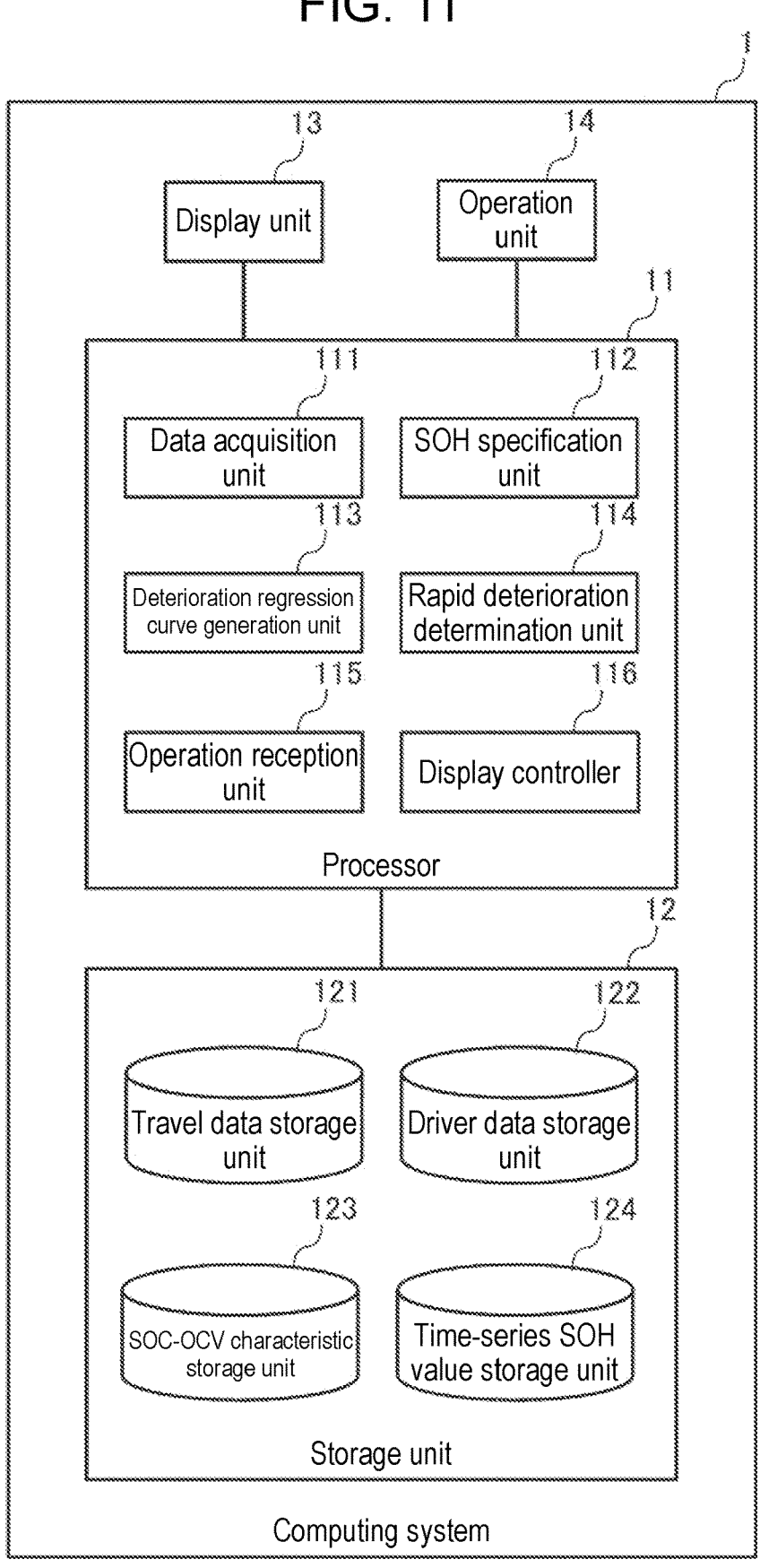
FIG. 11 is a diagram illustrating a configuration example of a computing system according to a second exemplary embodiment.

FIG. 11 is a diagram illustrating a configuration example of computing system 1 according to a second exemplary embodiment. Computing system 1 includes processor 11, storage unit 12, display unit 13, and operation unit 14. Processor 11 includes data acquisition unit 111, SOH specification unit 112, deterioration regression curve generation unit 113, rapid deterioration determination unit 114, operation reception unit 115, and display controller 116. The function of processor 11 can be implemented by cooperation of a hardware resource and a software resource, or by the hardware resource alone. As the hardware resources, a CPU, a graphics processing unit (GPU), a ROM, a RAM, an ASIC, an FPGA, and other LSIs can be used. As the software resources, programs such as an operating system and an application can be used.

Storage unit 12 includes travel data storage unit 121, driver data storage unit 122, SOC-OCV characteristic storage unit 123, and time-series SOH value storage unit 124. Storage unit 12 includes a nonvolatile recording medium such as a hard disk drive (HDD) and a solid state drive (SSD), and records various types of programs and data.

Travel data storage unit 121 stores travel data collected from the plurality of electrically-driven vehicles 3 owned by the business operator. Driver data storage unit 122 stores data of a plurality of drivers belonging to the business operator. For example, the total travel distance of each electrically-driven vehicle 3 that is driven is managed for each driver.

SOC-OCV characteristic storage unit 123 stores SOC-OCV characteristics of the plurality of battery modules 41 respectively mounted in the plurality of electrically-driven vehicles 3 owned by the business operator. As the SOC-OCV characteristic of battery module 41, one acquired from each electrically-driven vehicle 3 may be used, or one estimated based on the travel data collected from each electrically-driven vehicle 3 may be used.

In the latter case, an SOC-OCV characteristic estimation unit (not illustrated) of processor 11 extracts a set of the SOC and the voltage ($\approx$OCV) in the period during which battery module 41 can be regarded as being in a resting state from a set of the SOC and the voltage at the plurality of times included in the acquired battery data, and approximates the SOC-OCV characteristic based on the plurality of extracted sets of the SOC and the OCV. The SOC-OCV characteristic estimation unit may generate common SOC-OCV characteristic of battery module 41 of the same type based on data of the set of the SOC and the OCV acquired from the plurality of electrically-driven vehicles 3 in which battery modules 41 of the same type are respectively mounted. The SOC-OCV characteristic may be stored in units of cells.

Time-series SOH value storage unit 124 stores time-series data of the SOH for each battery module 41. The time-series data of the SOH is recorded, for example, at a frequency of once a day, once every few days, or once a week.

Display unit 13 includes a display such as a liquid crystal display or an organic EL display, and displays an image generated by processor 11. Operation unit 14 is a user interface such as a keyboard, a mouse, and a touch panel, and accepts user's operations in computing system 1.

Data acquisition unit 111 acquires travel data including battery data of battery module 41 mounted in each of the plurality of electrically-driven vehicle 3, and stores the acquired travel data in travel data storage unit 121. SOH specification unit 112 specifies the SOH of battery module 41 mounted in each electrically-driven vehicle 3 based on the battery data included in the travel data acquired by data acquisition unit 111. SOH specification unit 112 stores the specified SOH in time-series SOH value storage unit 124.

When the acquired battery data includes the SOH, SOH specification unit 112 can use the acquired SOH as it is. When the acquired battery data does not include the SOH but includes the voltage, the current, the temperature, and the SOC, the SOH can be calculated based on (Equation 1) and (Equation 2). That is, based on time transition of the current included in the battery data, SOH specification unit 112 calculates the current integration amount Q in the period between the two time points at which the two OCVs are acquired, and applies the calculated current integration amount Q to (Equation 1), thereby estimating the FCC. SOH specification unit 112 calculates the SOH by applying the calculated FCC to (Equation 2).

When neither the SOC nor the SOH is included in the acquired battery data, SOH specification unit 112 applies the voltage ($\approx$OCV) in the period during which battery module 41 can be regarded as being in the resting state to the SOC-OCV characteristic, thereby estimating the SOC. Alternatively, SOH specification unit 112 estimates the SOC by integrating the current values in a certain period. By using the estimated SOC, SOH specification unit 112 calculates the SOH similarly to the case in which the SOC is included in the battery data.

Deterioration regression curve generation unit 113 generates a deterioration regression curve of each battery module 41 by performing curve regression on a plurality of SOHs specified in time series for each battery module 41. Rapid deterioration determination unit 114 calculates a difference or a ratio between deterioration coefficient $w_1$ of the deterioration regression curve of battery module 41 generated based on the plurality of SOHs in the first data section and deterioration coefficient $w_1$ of the deterioration regression curve of battery module 41 generated based on the plurality of SOHs in the second data section in the time-series SOH of specific battery module 41. Rapid deterioration determination unit 114 determines whether or not rapid deterioration has occurred in battery module 41 based on the calculated difference or ratio therebetween.

Operation reception unit 117 receives a user's operation with respect to operation unit 14. Display controller 118 causes display unit 13 to display various types of information. In the second exemplary embodiment, a determination result of rapid deterioration of each battery module 41 is displayed.

As described above, according to the present exemplary embodiment, the rapid deterioration of battery module 41 can be detected with high accuracy without disassembling battery module 41 by referring to the difference or the ratio between deterioration coefficients $w_1$ of the plurality of deterioration regression curves generated by changing the data section. Even when data including an SOH estimation error is used as in battery module 41 mounted in electrically-driven vehicle 3, robust detection can be performed. According to the experiments of the inventor of the present invention, it has been found that the maximum error can be suppressed to about 5% with the SOHs of about 100 points. When the SOH is estimated at a frequency of once a day, rapid deterioration can be detected with high accuracy in a little more than three months. Note that the error is reduced as the number of SOHs increases.

A method of determining the rapid deterioration based on a change amount of a slope of a straight line obtained by performing linear regression on a change amount of the FCC or the SOH of battery module 41 is also considered. This method is considered to function effectively when the error or noise is small, but when the error or noise is large, the determination of the rapid deterioration may be unstable.

On the other hand, in the present exemplary embodiment, data sections of the time-series SOH are delimited and then the deterioration regression curve is generated. In a normal deterioration, a substantial change does not occur in deterioration coefficient w1 of the deterioration regression curve. By using deterioration coefficient w1 of the deterioration regression curve as a parameter, it is possible to detect a change in the deterioration regression curve itself due to the rapid deterioration. By detecting the change in the deterioration regression curve itself, it is possible to perform robust detection as compared with the case of detecting the change in the slope of the straight line obtained by performing linear regression on the change amount of the FCC or the SOH.

When the rapid deterioration occurs in battery module 41 mounted in electrically-driven vehicle 3, the travelable distance of electrically-driven vehicle 3 rapidly decreases. By detecting the rapid deterioration, it is possible to replace electrically-driven vehicle 3 at an appropriate time and to change the usage method. By detecting the rapid deterioration of battery module 41 in this manner, it is possible to improve the safety for use of battery module 41.

In addition, in a case where computing system 1 determines the presence or absence of the rapid deterioration based on the measurement data transmitted from electrically-driven vehicle 3 instead of battery management unit 42 in electrically-driven vehicle 3, it is possible to improve the efficiency of vehicle management of a business operator who owns a large number of electrically-driven vehicles 3.

The present disclosure has been described above based on the exemplary embodiment. It is to be understood by the person of ordinary skill in the art that the exemplary embodiment is an example, that combinations of its configuration elements and processing processes can have various modified examples, and that such modified examples are also within the scope of the present disclosure.

In the above-described exemplary embodiment, an example in which the data section is delimited by the number of SOHs has been described. In this regard, the data section may be delimited by the number of days (for example, 100 days or the like). In this case, it is easy to set the confirmation of the presence or absence of the rapid deterioration of battery module 41 as one of the items of periodic vehicle inspection.

In the above-described exemplary embodiment, deterioration regression curve generation unit 4614 compares deterioration coefficient $w_1$ based on the data in the first data section with deterioration coefficient $w_1$ based on the data in the second data section. In this regard, deterioration regression curve generation unit 4614 may compare deterioration coefficient $w_1$ based on the data in the first data section with a value (for example, an average value, a variance value, or a standard deviation value) obtained by statistically process-ing the plurality of deterioration coefficients $w_1$ based on the data in the plurality of data sections.

In the case of performing the comparison using the variance value, deterioration regression curve generation unit 4614 compares a square value of the deviation of deterioration coefficient $w_1$ based on the data in the first data section with variance values of the plurality of deterioration coefficients $w_1$ based on the data in the plurality of data sections. In the case of performing the comparison using the standard deviation value, deterioration regression curve gen-eration unit 4614 compares an absolute value of the devia-tion of deterioration coefficient $w_1$ based on the data in the first data section with standard deviation values of the plurality of deterioration coefficients $w_1$ based on the data in the plurality of data sections. In these cases, rapid deterio-ration can be detected with higher accuracy.

A method of determining the rapid deterioration accord-ing to the above-described exemplary embodiment may be used in combination with another method of determining the rapid deterioration. For example, there is a method of measuring an AC impedance value of battery module 41 by applying an AC signal of a frequency band (for example, 100 Hz to 10 kHz) in which the electrolyte solution reacts from the outside of battery module 41, and detecting or predicting the rapid deterioration of battery module 41 depending on whether or not the measured AC impedance value is equal to or greater than a threshold. In this method, a circuit configured to apply an AC signal to battery module 41 and to measure an AC impedance value is required. On the other hand, in the method of determining the rapid deterioration according to the present exemplary embodi-ment, the circuit is unnecessary.

When it is determined that the rapid deterioration has occurred by the method of determining the rapid deteriora-tion according to the present exemplary embodiment, elec-trically-driven vehicle 3 may be moved to a facility (for example, a car dealer) having a circuit device capable of measuring an AC impedance value of battery module 41 to determine the rapid deterioration based on the AC imped-ance value.

In order to notify a user of a warning at an early stage after occurrence of the rapid deterioration in battery module 41, it is necessary to frequently perform the rapid deterioration determination processing. When the method of determining the rapid deterioration according to the present exemplary embodiment is frequently performed (for example, every time one piece of data is added), the probability of errone-ously determining that the rapid deterioration has occurred increases even though the rapid deterioration has not actu-ally occurred.

On the other hand, if the processing of determining the rapid deterioration according to the exemplary embodiment is positioned as a primary determination and the processing of determining the rapid deterioration based on the AC impedance value is positioned as a secondary determination, the probability of erroneous determination decreases even when the method of determining the rapid deterioration according to the present exemplary embodiment is per-formed at a high frequency. That is, the rapid deterioration of battery module 41 can be detected at an early stage with high accuracy.

In the above-described exemplary embodiment, an example of determining the rapid deterioration of battery module 41 mounted in electrically-driven vehicle 3 is assumed. In this regard, electrically-driven vehicle 3 may be a two-wheeled electric motorcycle (electric scooter) or an electric bicycle. Electrically-driven vehicle 3 also includes low-speed electrically-driven vehicle 3 such as a golf cart and a land car used in a shopping mall or an entertainment facility.

The target in which battery module 41 is mounted is not limited to electrically-driven vehicle 3. For example, elec-trically-driven mobile units such as an electrically-driven ship, a railway vehicle, and a multi-copter (drone) are also included. The target on which battery module 41 is mounted also includes a stationary power storage system and a consumer electronic device (smartphone, notebook PC, and the like).

The exemplary embodiment may be specified by the following items.

[Item 1] Battery management device (42) including: mea-surement unit (43 to 45) configured to measure at least a voltage and a current of battery (E1, 41); SOH estimation unit (4613) configured to estimate a state of health (SOH) of battery (E1, 41) based on measurement data of battery (E1, 41); deterioration regression curve generation unit (4614) configured to perform curve regression on a plurality of the SOHs specified in time series for battery (E1, 41) to generate a deterioration regression curve of battery (E1, 41); and rapid deterioration determination unit (4615) configured to determine whether or not rapid deterioration has occurred in battery (E1, 41) based on a difference or a ratio between a deterioration coefficient of a deterioration regression curve of battery (E1, 41) generated based on the plurality of SOHs in a first data section and a deterioration coefficient of a deterioration regression curve of battery (E1, 41) generated based on the plurality of SOHs in a second data section.

Battery (E1, 41) may be cell E1 or module 41.

According to this configuration, rapid deterioration of battery (E1, 41) can be detected with high accuracy.

[Item 2] Battery management device (42) according to Item 1, wherein rapid deterioration determination unit (4615) determines that the rapid deterioration has occurred in battery (E1, 41) when the difference or the ratio deviates from a predetermined range.

According to this configuration, by detecting deviation from normal deterioration, rapid deterioration can be detected with high accuracy.

[Item 3] Battery management device (42) according to Item 1 or 2, wherein the first data section is a section including a pieces of the SOH in the past from the last specified SOH, and the second data section is a section including b (b>a) pieces of the past SOH from the last specified SOH.

According to this configuration, by overlapping the data sections, stable detection can be performed.

[Item 4] Battery management device (42) according to Item 1 or 2, wherein the first data section is a section including a pieces of the SOH in the past from the last specified SOH, and the second data section is a section including a pieces of the SOH in the past from the last specified SOH excluding the first data section.

According to this configuration, early detection can be realized by not overlapping the data sections.

[Item 5] Battery management device (42) according to Item 1 or 2, wherein the second data section includes a plurality of data sections, and a deterioration coefficient in the second data section is a value obtained by statistically processing respective deterioration coefficients in the plu-rality of data sections.

According to this configuration, detection accuracy can be further improved.

[Item 6] Computing system (1) including: data acquisition unit (111) configured to acquire measurement data of battery (E1, 41); SOH specification unit (112) configured to specify an SOH of battery (E1, 41) based on the measurement data of battery (E1, 41); deterioration regression curve generation unit (113) configured to perform curve regression on a plurality of the SOHs specified in time series for battery (E1, 41) to generate a deterioration regression curve of battery (E1, 41); and rapid deterioration determination unit (114) configured to determine whether or not rapid deterioration has occurred in battery (E1, 41) based on a difference or a ratio between a deterioration coefficient of a deterioration curve of battery (E1, 41) generated based on the plurality of SOHs in a first data section and a deterioration coefficient of a deterioration curve of battery (E1, 41) generated based on the plurality of SOHs in a second data section.

According to this configuration, rapid deterioration of battery (E1, 41) can be detected with high accuracy.

[Item 7] A battery (E1, 41) deterioration predicting method including: specifying an SOH of battery (E1, 41) based on measurement data of battery (E1, 41); performing curve regression on a plurality of the SOHs specified in time series for battery (E1, 41) to generate a deterioration regression curve of battery (E1, 41); and determining whether or not rapid deterioration has occurred in battery (E1, 41) based on a difference or a ratio between a deterioration coefficient of a deterioration regression curve of battery (E1, 41) generated based on the plurality of SOHs in a first data section and a deterioration coefficient of a deterioration regression curve of battery (E1, 41) generated based on the plurality of SOHs in a second data section.

According to this configuration, rapid deterioration of battery (E1, 41) can be detected with high accuracy.

[Item 8] A battery (E1, 41) deterioration predicting program configured to cause a computer to execute processing of: specifying an SOH of battery (E1, 41) based on measurement data of battery (E1, 41); performing curve regression on a plurality of the SOHs specified in time series for battery (E1, 41) to generate a deterioration regression curve of battery (E1, 41); and determining whether or not rapid deterioration has occurred in battery (E1, 41) based on a difference or a ratio between a deterioration coefficient of a deterioration regression curve of battery (E1, 41) generated based on the plurality of SOHs in a first data section and a deterioration coefficient of a deterioration regression curve of battery (E1, 41) generated based on the plurality of SOHs in a second data section.

According to this configuration, rapid deterioration of battery (E1, 41) can be detected with high accuracy.

REFERENCE MARKS IN THE DRAWINGS

1: computing system
E1-En: cell
T1, T2: temperature sensor
RY1, RY2: relay
3: electrically-driven vehicle
4: charger
11: processor
111: data acquisition unit
112: SOH specification unit
113: deterioration regression curve generation unit
114: rapid deterioration determination unit
115: operation reception unit
116: display controller
12: storage unit
121: travel data storage unit

122: driver data storage unit
123: SOC-OCV characteristic storage unit
124: time-series SOH value storage unit
13: display unit
14: operation unit
30: vehicle controller
34: motor
35: inverter
36: wireless communication unit
36a: antenna
38: charging cable
40: battery system
41: battery module
42: battery management unit
43: voltage measurement unit
44: temperature measurement unit
45: current measurement unit
46: battery controller
461: processor
4611: SOC estimation unit
4612: FCC estimation unit
4613: SOH estimation unit
4614: deterioration regression curve generation unit
4615: rapid deterioration determination unit
4616: data transmission unit
462: storage unit
4621: SOC-OCV characteristic storage unit
4622: battery data storage unit
4623: time-series SOH value storage unit

The invention claimed is:

1. A vehicle comprising:

a battery;

one or more memories;

a vehicle controller; and at least one processor each coupled to at least one of the one or more memories and configured to perform operations comprising:

obtaining at least a voltage and a current of the battery;

estimating a state of health of the battery based on measurement data of the battery;

performing curve regression on a plurality of states of health identified in time series for the battery to generate a deterioration regression curve of the battery, wherein the plurality of states of health includes the state of health, and the deterioration regression curve is expressed by a formula:

$$\mathrm{SOH}=w_0+w_1\sqrt{t},$$

where SOH represents the state of health, $w_0$ represents an initial value, $w_1$ represents a deterioration coefficient, t represents the time series, and the curve regression is performed to determine $w_1$;

determining whether or not rapid deterioration has occurred in the battery based on a difference or a ratio between a first value of $w_1$ corresponding to the deterioration regression curve of the battery generated based on the plurality of states of health in a first data section and a second value of $w_1$ corresponding to the deterioration regression curve of the battery generated based on the plurality of states of health in a second data section, the plurality of the states of health in the first data section and the plurality of the states of health in the second data section being included in the states of health specified in time series for the battery;

generating a signal for turning on a warning lamp in response to determining that the rapid deterioration has occurred in the battery; and transmitting the signal to the vehicle controller, wherein the vehicle controller is configured to turn on the warning lamp indicating an abnormality of the battery in response to receiving the signal.

2. The vehicle according to claim 1, wherein the determining whether or not rapid deterioration has occurred in the battery comprises determining that the rapid deterioration has occurred in the battery when the difference or the ratio deviates from a predetermined range.

3. The vehicle according to claim 1, wherein the first data section is a section including M states of health counted backwards from a last specified state of health in the time series among the plurality of states of health, the M being an integer equal to larger than 1, and the second data section is a section including N states of health counted backwards from the last specified state of health, N being an integer larger than M.

4. The vehicle according to claim 1, wherein the first data section is a section including M states of health counted backwards from a last specified state of health in the time series among the plurality of states of health, the M being an integer equal to larger than 1, and the second data section is a section including M states of health counted backwards from a state of health immediately prior to an M-th state of health in the first section among the plurality of states of health.

5. The vehicle according to claim 1, wherein the second data section includes a plurality of data sections, and the second value of $w_1$ is obtained by statistically processing respective $w_1$ values in the plurality of data sections.

6. A vehicle controlling method comprising:

identifying, by a battery controller installed on the vehicle, a state of health of a battery installed on a vehicle based on measurement data of the battery;

performing, by the battery controller, curve regression on a plurality of states of health specified in time series for the battery to generate a deterioration regression curve of the battery, the plurality of states of health including the state of health, and the deterioration regression curve is expressed by a formula:

$$SOH = w_0 + w_1\sqrt{t},$$

where SOH represents the state of health, $w_0$ represents an initial value, $w_1$ represents a deterioration coefficient, t represents the time series, and the curve regression is performed to determine $w_1$;

determining, by the battery controller, whether or not rapid deterioration has occurred in the battery based on a difference or a ratio between a first value of $w_1$ corresponding to the deterioration curve of the battery generated based on the plurality of states of health in a first data section and a second value of $w_1$ corresponding to the deterioration curve of the battery generated based on the plurality of states of health in a second data section;

generating, by the battery controller, a signal for turning on a warning lamp in response to determining that the rapid deterioration has occurred in the battery;

transmitting, by the battery controller, the signal to a vehicle controller installed on the vehicle; and turning on, by the vehicle controller, the warning lamp indicating an abnormality of the battery, in response to receiving the signal.

7. The vehicle according to claim 3, wherein M is equal to or more than one hundred.

8. The vehicle according to claim 4, wherein M is equal to or more than one hundred.

* * * * *